United States Patent [19]
Morisawa

[11] Patent Number: 5,651,601
[45] Date of Patent: Jul. 29, 1997

[54] STROBE DEVICE

[75] Inventor: Tahei Morisawa, Tokyo, Japan

[73] Assignee: Asahi Kogaku Kogyo Kabushiki Kaisha, Tokyo, Japan

[21] Appl. No.: 315,628

[22] Filed: Sep. 30, 1994

[30] Foreign Application Priority Data

Oct. 1, 1993 [JP] Japan .................. 5-058275 U

[51] Int. Cl.$^6$ .................................. G03B 15/02
[52] U.S. Cl. .................. 362/16; 362/8; 362/265
[58] Field of Search .................. 362/8, 10, 11,
362/16, 263, 265, 800, 227; 354/149.11,
145.1; 315/241 P, 241 S

[56] References Cited

U.S. PATENT DOCUMENTS

| | | | |
|---|---|---|---|
| 3,127,112 | 3/1964 | McCammon et al. | 315/241 P |
| 4,104,706 | 8/1978 | Hanson et al. | 362/11 |
| 4,282,559 | 8/1981 | Audesse et al. | 362/240 |
| 4,326,242 | 4/1982 | Broadt et al. | 362/11 |
| 5,015,918 | 5/1991 | Copeland | 362/227 |
| 5,028,943 | 7/1991 | Ishii et al. | 354/149.11 |
| 5,299,100 | 3/1994 | Bellows et al. | 362/263 |
| 5,347,259 | 9/1994 | Jongewaard | 362/297 |

*Primary Examiner*—Y. My Quach
*Attorney, Agent, or Firm*—Greenblum & Bernstein, P.L.C.

[57] ABSTRACT

A light emission unit of strobe device is mounted to a strobe circuit base plate by rigid members. The members serve both as mounting members and as conductive links to the electrodes of the light emission unit.

18 Claims, 5 Drawing Sheets

STROBE DEVICE

BACKGROUND OF THE INVENTION

The present invention relates to a strobe device in a camera.

Modern cameras are typically provided with a built-in strobe device. In a conventional strobe device, the elements of the strobe circuit, including a strobe drive circuit, a strobe charging circuit, and a light emission unit (including a flash tube), are independently manufactured. The strobe circuits and the light emission unit as above are conventionally connected with conductive lead wires.

When the strobe device is assembled and mounted in the camera, the strobe circuits and the light emission unit are installed at respective positions, and manufacturing efficiency is therefore poor. Further, when such a strobe device is installed in a camera, the soldered portion of the lead wires may be weakened or jarred and the lead wires may be knocked off. Additionally, a faulty contact or short circuit may occur. If such a phenomenon occurs, the strobe portion of the camera functions improperly, and the desired intensity of light cannot be obtained. In the worst case, the strobe device itself may break.

SUMMARY OF THE INVENTION

It is therefore an object of the present invention to provide an improved strobe device which is easily installed in a camera, and wherein the portion where the circuit and the light emission unit are connected is strong and resistant to outside forces.

For the above object, according to the present invention, a strobe device incorporated in a camera, which comprises a light emission unit for emitting light, and a circuit board having a circuit for driving said light emission unit. The light emission unit is rigidly secured to said circuit board.

Optionally, the strobe device is provided with a plurality of mounting members for mounting the light emission unit on the circuit board.

Further, the plurality of mounting members comprise conductive electrodes electrically connected to the light emission unit. The conductive electrodes are electrically connected with the circuit, such that light emission unit is electrically connected with the circuit through the mounting members.

DESCRIPTION OF THE ACCOMPANYING DRAWINGS

DESCRIPTION OF THE EMBODIMENTS

Figure 1:
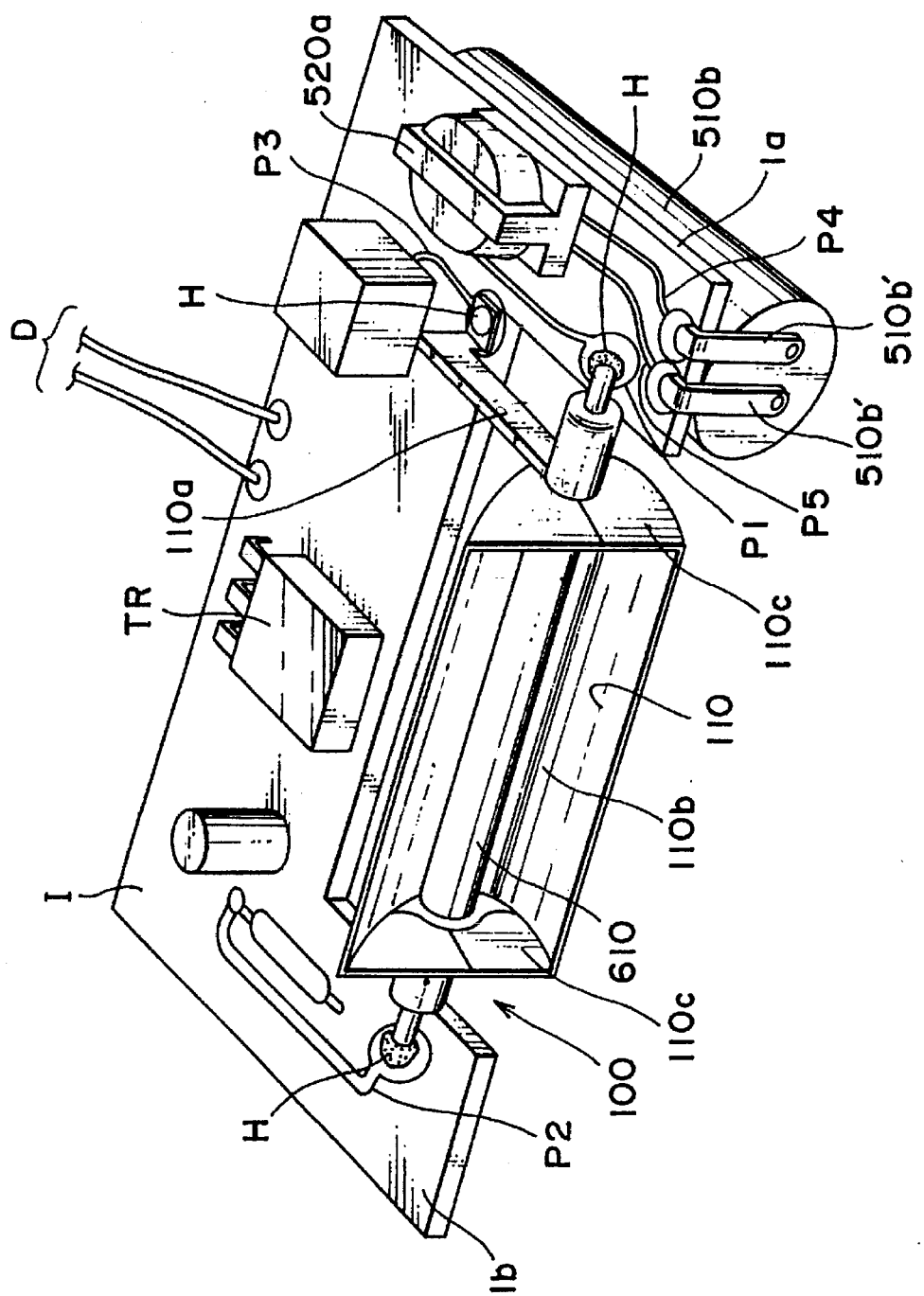
FIG. 1 is a perspective view of a strobe device embodying the present invention.
Figure 2:
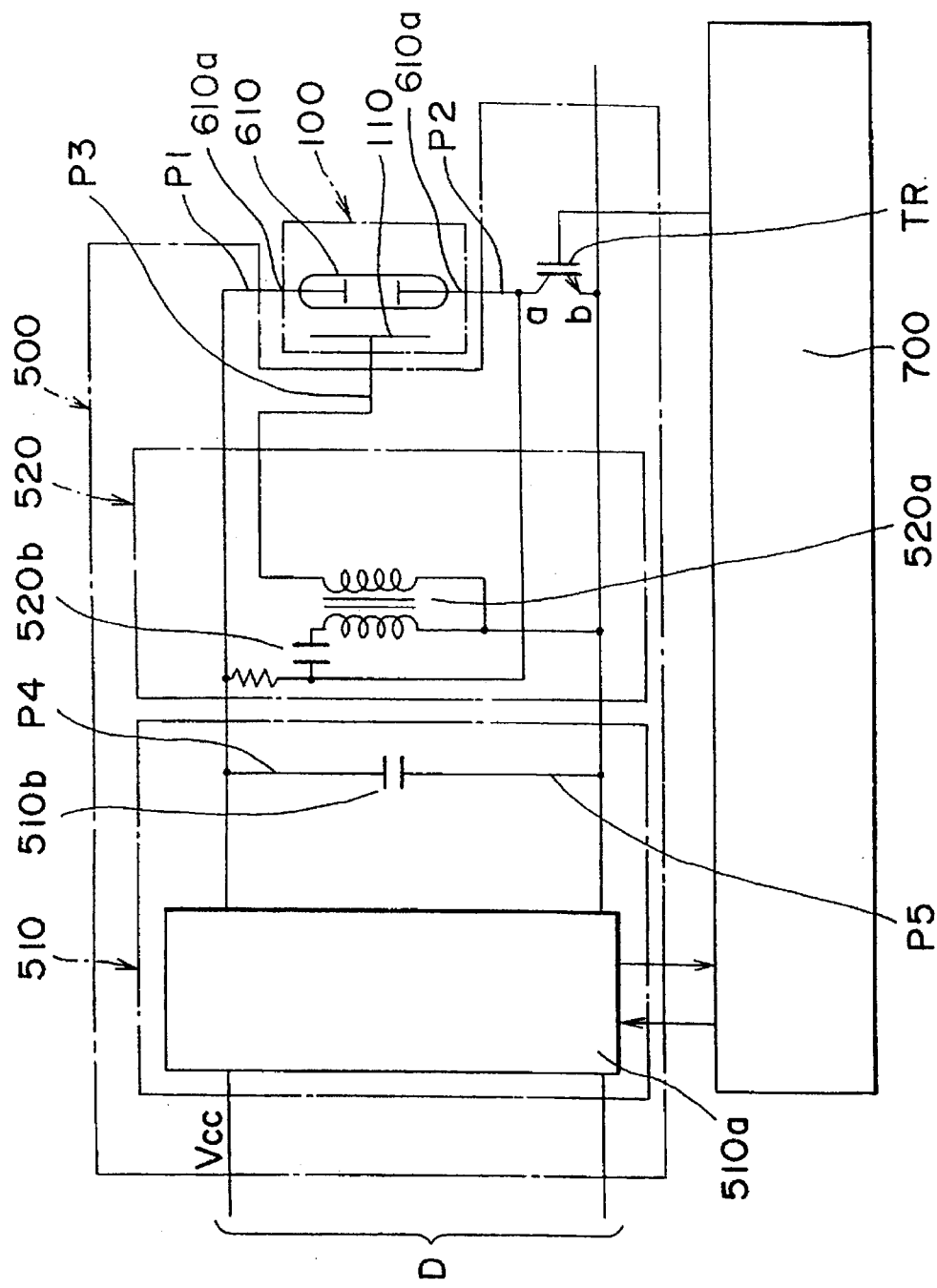
FIG. 2 is a strobe circuit.

FIG. 1 is a perspective view of a strobe device embodying the present invention. FIG. 2 shows a strobe circuit 500.

In the first embodiment of the present invention illustrated in FIG. 1, a base plate I comprises a printed circuit board on which the strobe circuit 500 is provided as a printed circuit. The printed circuit is preferably formed on both sides of the plate I. A transformer 520a, a discharge capacitor 510b, and a switching transistor TR are fixed on the base plate I. The elements provided on the base plate I are interconnected through at least printed conductive patterns P1, P2, and P3. As shown in FIG. 1, the base plate I is formed to have mounting portions Ia and Ib, on which a light emission unit 100 is secured.

The light emission unit 100 has a discharge tube 610 in which xenon gas is sealed, and a reflector 110 for directing the light emitted by the xenon tube 610 towards a predetermined light emission area. The reflector 110 has a surface 110b which has a rounded V shape in section, and two side surfaces 110c. The xenon tube 610 substantially contacts the rounded V shape opposite to the open end of the reflector 110.

The light emission unit 100 is further provided with a supporting arm 110a which extends from the light emission unit 100, the other end of the supporting arm 110a being soldered to an end of the printed conductive pattern P3 on the base plate I. In this embodiment, the supporting arm 110a is made of a conductive material. Electrodes at both ends of the xenon tube 610 are formed to have a cylindrical shape, and are project outwards through each of the side surfaces 110c to be soldered to the printed conductive patterns P1 and P2 on the mounting portions Ia and Ib. Thus, the light emission unit 100 is firmly supported as the rigid electrodes are soldered to the printed conductive patterns P1 and P2, and the supporting arm 110a is soldered with the printed conductive pattern P3.

The strobe circuit 500, shown in FIG. 2, comprises a charging circuit 510 and a trigger circuit 520. The charging circuit 510 is connected to a battery, for example, through terminals D, and includes a DC-DC converter, for increasing the low voltage of the battery to a high voltage, and the discharge capacitor 510b for storing a charge at the increased high voltage. The discharge capacitor 510b has a pair of electrodes 510b' and 510b' (FIG. 1), which are connected to printed conductive patterns P4 and P5. One of the electrodes 510b' of the discharge capacitor 510b is connected to an electrode of the xenon tube 610 through the printed conductive patterns P4 and P1. The other electrode 510b' of the discharge capacitor 510b is connected to the opposite electrode of the xenon tube 610 through the printed conductive pattern P5, the transistor switch TR, and the printed conductive pattern P2.

The trigger circuit 520 includes the transformer 520a that outputs a high secondary voltage, and a capacitor 520b for storing a charge of the voltage output by the DC-DC converter 510a. When transistor TR is turned OFF, capacitor 520b is charged. When transistor TR is turned ON, a voltage is applied to a primary coil of the transformer 520a, causing a secondary voltage across a secondary coil of the transformer 520a. The secondary voltage of the transformer 520a is applied to the reflector 110 through the printed conductive pattern P3 and the support arm 110a.

The charging circuit 510 and the transistor TR are controlled by a control circuit 700. The control circuit 700 controls the charging circuit 510 to stop charging when the discharge capacitor 510b and the capacitor 520b are sufficiently charged. If a shutter button of the camera is depressed after capacitors 510b and 520b are sufficiently charged, the control circuit 700 turns ON transistor TR. When transistor TR is turned ON, the secondary voltage of the transformer 520a is applied to the reflector 110 to excite the xenon gas, and simultaneously the discharge capacitor 510b applies a high voltage to the electrodes 610a of the xenon tube 610 so that the light is emitted from the xenon tube 610.

Figure 3:
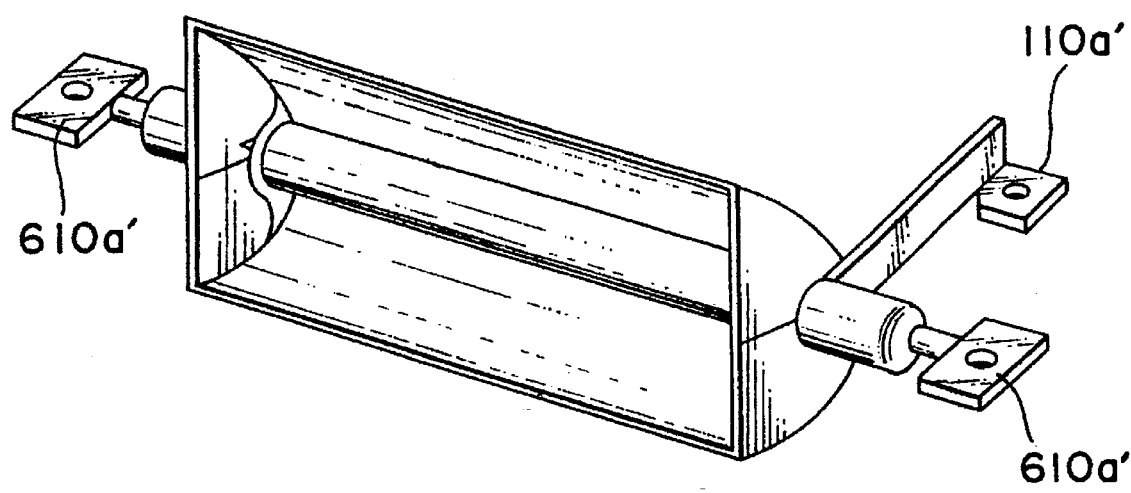
FIG. 3 is a perspective view of a light emission unit according to a second embodiment of the invention.

In the first embodiment described above, only the end of the support arm 110a is formed to be a flat terminal 110a', which is soldered to the printed conductive pattern P3. In a second embodiment shown in FIG. 3, the end portion of electrodes 610a are also formed to be flat terminals 610a'. The hole formed at the central portion of the flat terminals 110a' and 610a' facilitate soldering.

Figure 4:
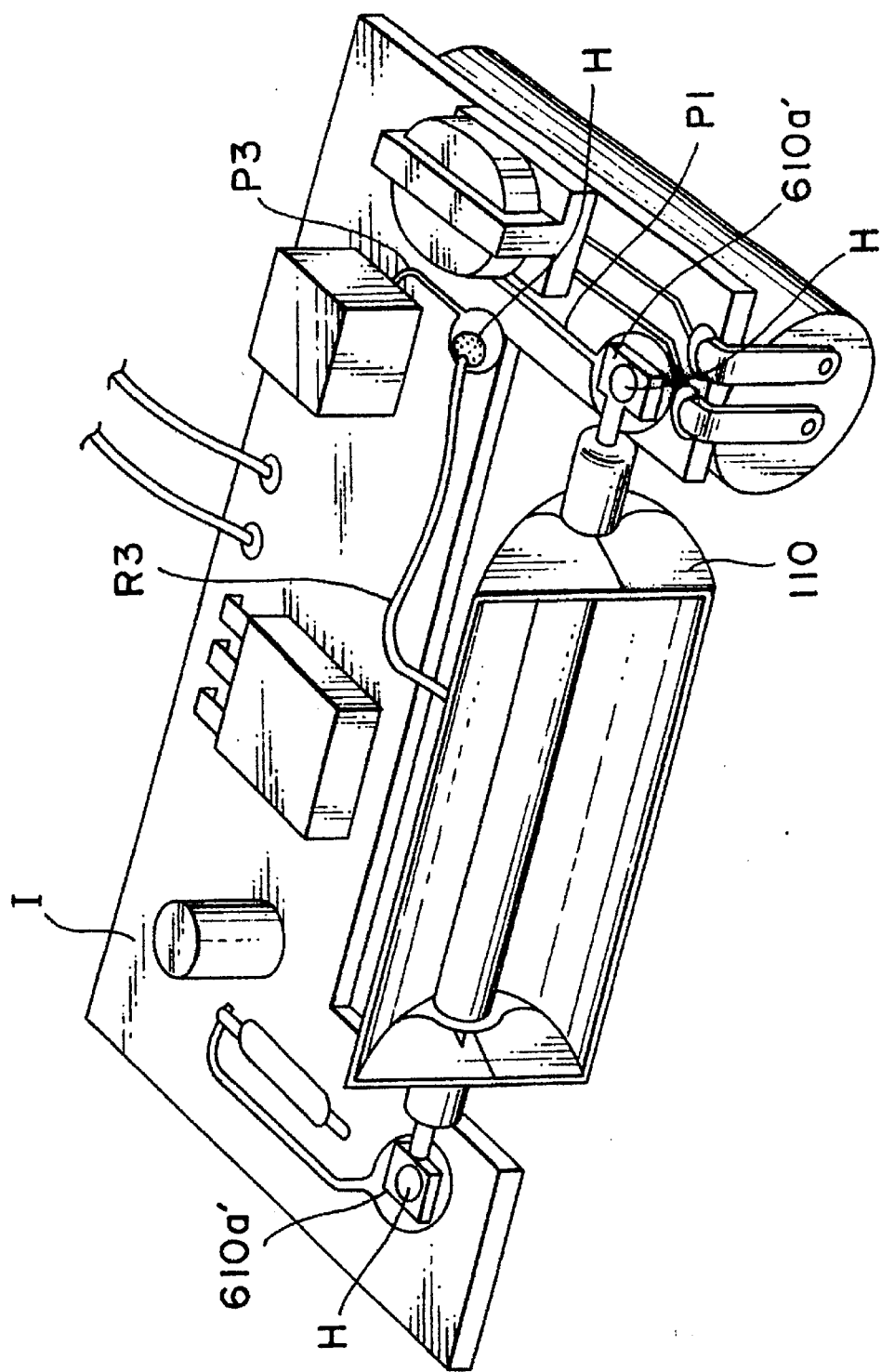
FIG. 4 is a perspective view of a strobe device according to a third embodiment of the invention.

FIG. 4 shows a third embodiment of the invention. In the third embodiment, the end of the electrodes 610a are formed as flat terminals, as in the second embodiment. Instead of the supporting arm 110a in the first or second embodiment, a wire R3 is used for connecting the printed conductive pattern P3 and the reflector 110.

Figure 5:
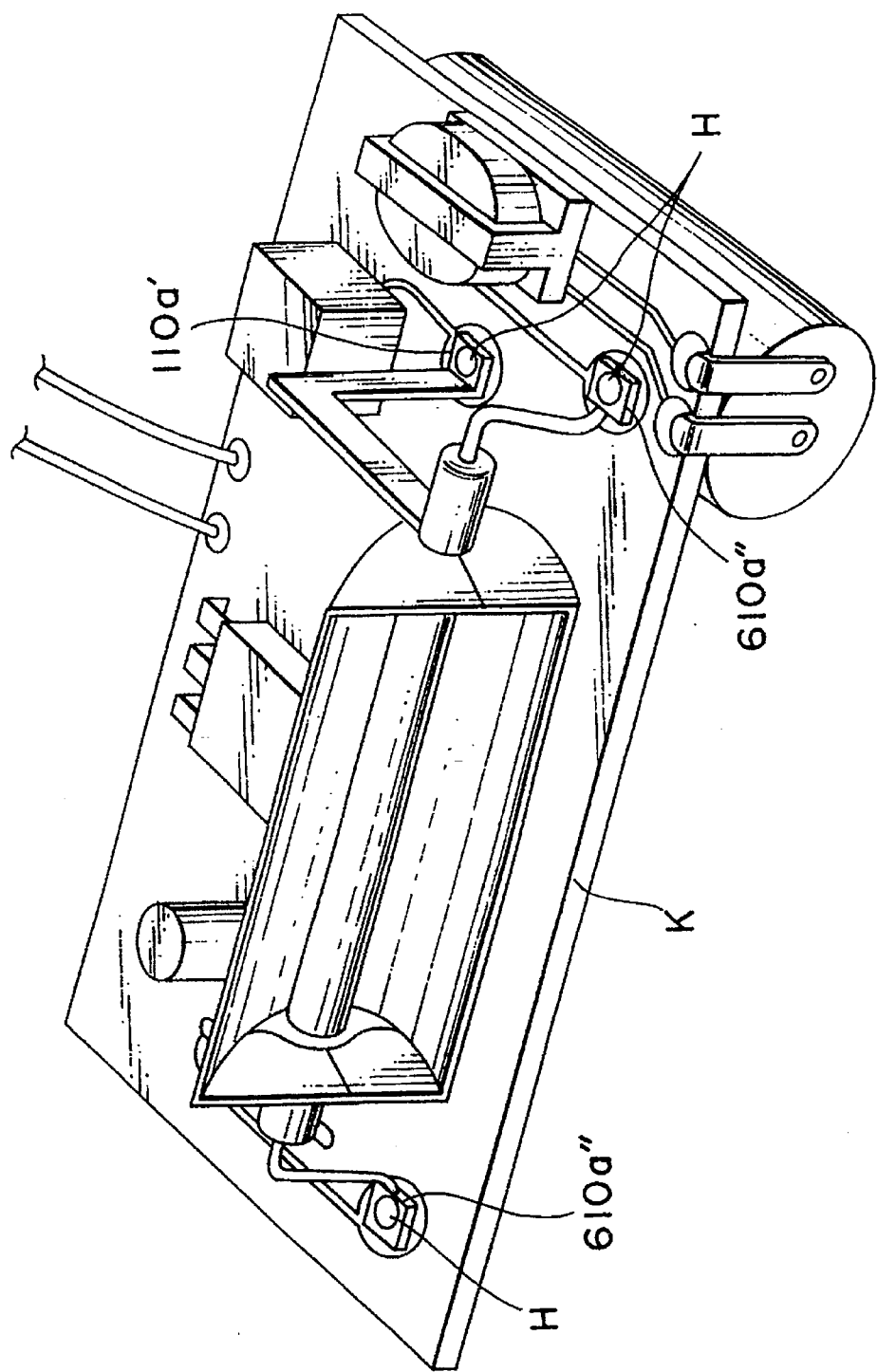
FIG. 5 is a perspective view of a strobe device according to a fourth embodiment of the invention.

FIG. 5 shows a fourth embodiment of the present invention. In the fourth embodiment, a rectangular base plate K is employed, and the light emission unit 100 is mounted on the base plate K by means of the flat terminals 610a" and 110a', which are similar to those in FIG. 3. However, the electrodes of the fourth embodiment are bent away from the light emission unit 100, so that the light emission unit 100 can be mounted without interfering with the base plate K.

As described above, according to the present invention, the light emission unit is rigidly secured to the strobe circuit base plate, and can be handled as a single unit. Manufacturing efficiency is thereby increased, and faulty soldering is avoidable.

The present disclosure relates to a subject matter contained in Japanese Utility Model Application No. HEI 5-058275, filed on Oct. 1, 1993, which is expressly incorporated herein in its entirety.

What is claimed is:

1. A strobe device incorporated in a camera, comprising:
a light emission unit that emits light, said light emission unit comprising a discharge tube that emits light when a gas sealed within said discharge tube is excited and a reflector that reflects light emitted by said discharge tube;
a circuit board comprising a circuit that drives said light emission unit, said light emission unit being rigidly supported by and directly secured to said circuit board, said discharge tube comprising a plurality of mounting members that mount said light emission unit on said circuit board; and
at least one of said plurality of mounting members mounts said reflector on said circuit board.

2. The strobe device according to claim 1, said plurality of mounting members comprising conductive mounting electrodes of said discharge tube, said conductive mounting electrodes being electrically connected to said circuit, whereby said discharge tube is electrically connected with said circuit through said mounting members.

3. The strobe device according to claim 2, said circuit board comprising a printed circuit board on which said circuit is printed, said driving circuit comprising a charging circuit.

4. The strobe device according to claim 2, wherein said plurality of mounting members are secured to said circuit board by a soldering connection.

5. The strobe device according to claim 4, said soldering connection comprising a single soldered connection between each said conductive mounting electrode and said circuit board.

6. The strobe device according to claim 1, said drives circuit comprising a charging circuit.

7. The strobe device according to claim 6, said charging circuit comprising a charge storage device.

8. The strobe device according to claim 7, said charging circuit further comprising a gas-exciting device.

9. The strobe device according to claim 8, said charge storage device comprising a capacitor and said gas exciting device comprising a transformer.

10. The strobe device according to claim 1, said circuit board rigidly supporting said reflector.

11. A strobe device incorporated in a camera, comprising:
a light emission unit for emitting light, said light emission unit comprising a discharge tube and a reflector that reflects light emitted by said discharge tube;
a circuit board having a circuit including at least one circuit element that actuats said light emission unit, said light emission unit being rigidly supported and directly secured by said circuit board; and
at least one electrode supporting said light emission unit and electrically coupling said light emission unit to said circuit board.

12. The strobe light device according to claim 11, said at least one circuit element comprising a charge storage device.

13. The strobe light device according to claim 12, said at least one circuit element further comprising a gas exciting device.

14. The strobe light device according to claim 13, said charge storage device comprising a capacitor and said gas exciting device comprising a transformer.

15. The strobe light device according to claim 11, further comprising means for applying a voltage to said reflector.

16. The strobe device according to claim 11, further comprising at least one electrode that supports said reflector and electrically coupling said reflector to said circuit board.

17. A strobe device incorporated in a camera, comprising:
a light emission unit that emits light, said light emission unit comprising a discharge tube that emits light when a gas sealed within said discharge tube is excited and a conductive gas exciting member that excites said gas;
a circuit board comprising a circuit that drives said light emission unit, said light emission unit being rigidly supported by and directly secured to said circuit board; and
said conductive, gas exciting member comprising a reflector for reflecting light emitted by said discharge tube.

18. The strobe device according to claim 17, further comprise a conductive mounting member that mounts said reflector on said circuit board, said conductive mounting member applying a voltage from said circuit board to said reflector that excites said gas.

* * * * *

UNITED STATES PATENT AND TRADEMARK OFFICE
CERTIFICATE OF CORRECTION

PATENT NO.  :   5,651,601
DATED       :   July 29, 1997
INVENTOR(S) :   MORISAWA TAHEI It is certified that error appears in the above-indentified patent and that said Letters Patent is hereby corrected as shown below:

Title page, under

Reference [56], of the printed patent, insert ---5,012,262 4/1991 Mogamiya et al---.

Reference [56], of the printed patent, insert ---5,021,814 6/1991 Sato---.

Column 4, line 23, of the printed patent, change "actuats" to ---actuates---.

Signed and Sealed this

Twenty-eighth Day of July, 1998

Attest:

BRUCE LEHMAN

Attesting Officer

Commissioner of Patents and Trademarks